United States Patent [19]

Squires

[11] Patent Number: 4,975,068

[45] Date of Patent: Dec. 4, 1990

[54] FLEXIBLE CABLE CONNECTOR

[75] Inventor: John J. Squires, Endicott, N.Y.

[73] Assignee: International Business Machines, Armonk, N.Y.

[21] Appl. No.: 446,574

[22] Filed: Dec. 4, 1989

[51] Int. Cl.$^5$ .............................................. H05K 1/00
[52] U.S. Cl. ...................................... 439/67; 439/77; 439/372; 439/498
[58] Field of Search ............................... 439/492–499, 439/67, 77, 260–267, 377, 378, 372

[56] References Cited

U.S. PATENT DOCUMENTS

| | | | |
|---|---|---|---|
| 2,211,955 | 8/1940 | Lindae | 200/166 |
| 2,925,592 | 2/1960 | Noyes | 340/366 |
| 2,968,016 | 1/1961 | Angele | 339/75 |
| 2,981,918 | 4/1961 | Gluck et al. | 339/103 |
| 3,076,951 | 2/1963 | Swanson | 339/91 |
| 4,420,203 | 12/1983 | Aug et al. | 339/17 |
| 4,538,865 | 9/1985 | Wakabayashi et al. | 439/67 |
| 4,629,271 | 12/1986 | Awano | 439/260 |
| 4,636,019 | 1/1987 | Gillett et al. | 339/17 |
| 4,647,125 | 3/1987 | Landi et al. | 439/67 |
| 4,808,112 | 2/1989 | Wood et al. | 439/67 |

OTHER PUBLICATIONS

IBM Technical Disclosure Bulletin, vol. 15, No. 5 (10/72) pp. 1614–1615.
IBM Technical Disclosure Bulletin, vol. 18, No. 11 (4/76) p. 3830.
IBM Technical Disclosure Bulletin, vol. 21, No. 6 (11/78) p. 2217.
IBM Technical Disclosure Bulletin, vol. 22, No. 2 (7/79) pp. 444–445.
IBM Technical Disclosure Bulletin, vol. 24, No. 2 (7/81) pp. 905, 906.
IBM Technical Disclosure Bulletin, vol. 25, No. 1 (6/82) pp. 370–371.

*Primary Examiner*—David L. Pirlot
*Attorney, Agent, or Firm*—Lawrence R. Fraley

[57] ABSTRACT

An electrical connector for electrically connecting the circuitry on a pair of flexible cables, the connector including a base member for having the two cables located thereon, means for aligning the two cables in precise alignment (e.g., a pair of pins on the base member), a clamp member for occupying first and second positions relative to the base member (the flexible cables being compressed and the circuitry thereof being in direct contact when the clamp is in the second position), compressible means (e.g., an elastomeric member) located between the clamp and base members for engaging at least one of the flexible cables to exert a force thereagainst when compressed, and retention means for retaining the clamp member in the second (clamping) position such that a high density connection is provided between both flexible cables. In one embodiment, the clamp is pivotally located on the base member, while in another embodiment the retention means is rotationally located on the clamp member. In both embodiments, a cam type of engagement is used.

23 Claims, 3 Drawing Sheets

FLEXIBLE CABLE CONNECTOR

TECHNICAL FIELD

This invention relates to connectors and more particularly to electrical connectors for use with flexible cables (or tapes) which include a plurality of conductors as part thereof.

CROSS REFERENCE TO COPENDING APPLICATIONS

In Ser. No. 07/266,538, now U.S. Pat. No. 4,902,234, entitled "Electrical Connector Assembly Including Pressure Exertion Member " (W. L. Brodsky et al) and filed Nov. 3, 1988, there is defined a connector assembly for connecting two circuit members (e.g., printed circuit board's, flexible cables) wherein a pressure exertion member is utilized. The pressure exertion member includes a metallic base, a resilient member, and several compressible elements as part thereof. This pressure exertion member may be used in the present invention.

In Ser. No. 07/285,971, now U.S. Pat. No. 4,907,975, entitled "Electrical Connector Utilizing Flexible Electrical Circuitry" (A. D. Knight et al), and filed Dec. 19, 1988, there is defined a connector assembly for connecting a flexible circuit (cable) to selected connectors on a substrate. A plurality (e.g., three) of pressure exerting means are utilized. This application also defines an assembly wherein paired flexible circuits are clamped against opposite surfaces of a PCB.

In Ser. No. 07/287,236, entitled "Connector For Connecting Flexible Film Integrated Circuit Carrier To Board Or Card And Use Thereof" (E. P. Dibble et al), and filed Dec. 21, 1988, there is defined a connector for electrically connecting a circuit carrier to a card or board (e.g., PCB) wherein the connector (a contact) includes a pin having stem and head portions wherein the head includes a plurality (e.g., three) of raised contacting "dot" portions thereon for providing contact. Contacts of this type may be used within the instant invention.

In Ser. No. 07/366,848, now U.S. Pat. No. 4,892,487, entitled "Connector Assembly With Movable Carriage " (David W. Dranchak et al) and filed June 15, 1989, there is defined an electrical connector assembly which includes a housing for containing a flexible circuit therein which functions to electrically interconnect two other circuit members (e.g., two printed circuit boards). A movable carriage within the housing moves to effect this contact.

BACKGROUND

The use of electrical connectors to connect flexible cables (which are also occasionally referred to in the art as tapes, particularly if of flat configuration) is known with examples being illustrated in U.S. Pat. Nos. 3,076,951 (G. Swanson), 2,981,918 (W. Gluck et al), 2,968,016 (W. Angele) and 4,636,019 (Gillett). Further examples are shown and described in IBM Technical Disclosure Bulletins Vol. 18, no. 11 (Apr. 1976), Vol. 25, no. 1 (June 1982) and Vol. 22, no. 2 (July 1979). In most of these examples, as well as in others in the art, such connectors provide electrical connection between a flexible circuit member (cable or tape) and a different circuit member (e.g., a relatively rigid circuit board), or, in the case wherein connection is desired between two individual flexible circuits, an additional electrically conductive means (e.g., a solid contact or the like) is required to provide same.

As will be defined herein, the electrical connector of the instant invention provides for a direct electrical interconnection between two circuits of a pair of individual flexible cables in a sound, effective manner without the need for additional connective means or the like. The relatively simplistic design of the invention assures such connection in a high density manner, as is highly desired in today's connector art, particularly that involving information handling systems (computers) to which the invention is particularly adapted. By the term high density is meant the provision of electrical connections between arrays of conductive elements (e.g., copper pads) having a density within the range of from about one hundred individual elements per square inch to about two hundred individual elements per square inch or, more specifically, arrays wherein such elements each have a total surface area of only about 0.076 sq. mm to about 0.178 sq. mm. In the event that connections are desired only between individual circuit lines (paths) which are exposed on a surface of the cable, the term high density is meant to include from about twenty lines per linear inch of cable (e.g., across the top surface of a flat cable member) to about thirty-five lines per linear inch. As can be appreciated, effective connections between such large numbers of elements per individual cable assures miniaturization of such structures, as is highly desired in the connector industry today, particularly that involved with computers. As will be further defined herein, the invention provides such connections while also substantially preventing possible damage to the relatively thin and often somewhat fragile cable (particularly when the cable is of the flat variety as is especially desired in the industry today).

It is believed that such a connector would constitute a significant advancement in the art.

DISCLOSURE OF THE INVENTION

It is, therefore, a primary object of this invention to enhance the art of electrical connectors by providing an electrical connector possessing, among others, the advantageous features defined herein, particularly the capability of directly interconnecting circuitry on two separate flexible cables wherein the conductive elements (e.g., contact pads, lines, etc) are arranged in a highly dense array.

It is another object of the invention to provide such a connector which can be operated in a relatively simple manner and which is also relatively inexpensive to produce.

In accordance with one aspect of the invention, there is provided an electrical connector for electrically connecting the circuitry on first and second flexible cables, the connector comprising a base member adapted for having the first and second flexible cables located thereon such that the circuitry thereof is oriented in a facing relationship, means on the base member for aligning the circuitry of the first and second flexible cables in precise alignment with respect to each other and a clamp member movably positioned on the base member and adapted for occupying first and second positions with respect thereto The clamp and base members clamp the first and second flexible cables together when the clamp member occupies the second position such that the circuitry on the first flexible cable directly contacts the circuitry on the second flexible cable. The invention also includes compressible means located between the base member and the clamp member for engaging at least one of the flexible cables during the clamping thereof and for being compressed during the clamping, the compressible means exerting a predetermined force against the engaged flexible cable when so compressed. The invention further includes retention means for retaining the clamp member in the second position with respect to the base member, the electrical connector providing high density connection between the two flexible cables.

In accordance with another aspect of the invention, there is provided an electrical connector for electrically connecting the circuitry on first and second flexible cables, the connector comprising a base member adapted for having the first and second flexible cables located thereon such that the circuitry thereof is oriented in a facing relationship, means on the base member for aligning the circuitry of the first and second flexible cables in precise alignment with respect to each other, and a clamp member positioned atop the flexible cables located on the base member and adapted for occupying first and second positions with respect to the base member. The clamp member and the base member clamp the first and second flexible cables together when the clamp member occupies the second position such that the circuitry on the first flexible cable directly contacts the circuitry on the second flexible cable. The connector also includes compressible means located between the base member and the clamp member for engaging at least one of the flexible cables during the clamping thereof and for being compressed during the clamping, this compressible means exerting a predetermined force against the engaged flexible cable when so compressed. The connector even further includes retention means movably positioned on the clamp member for retaining the clamp member against the flexible cables when the clamp member occupies the second position, the electrical connector providing high density connection between the flexible cables.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
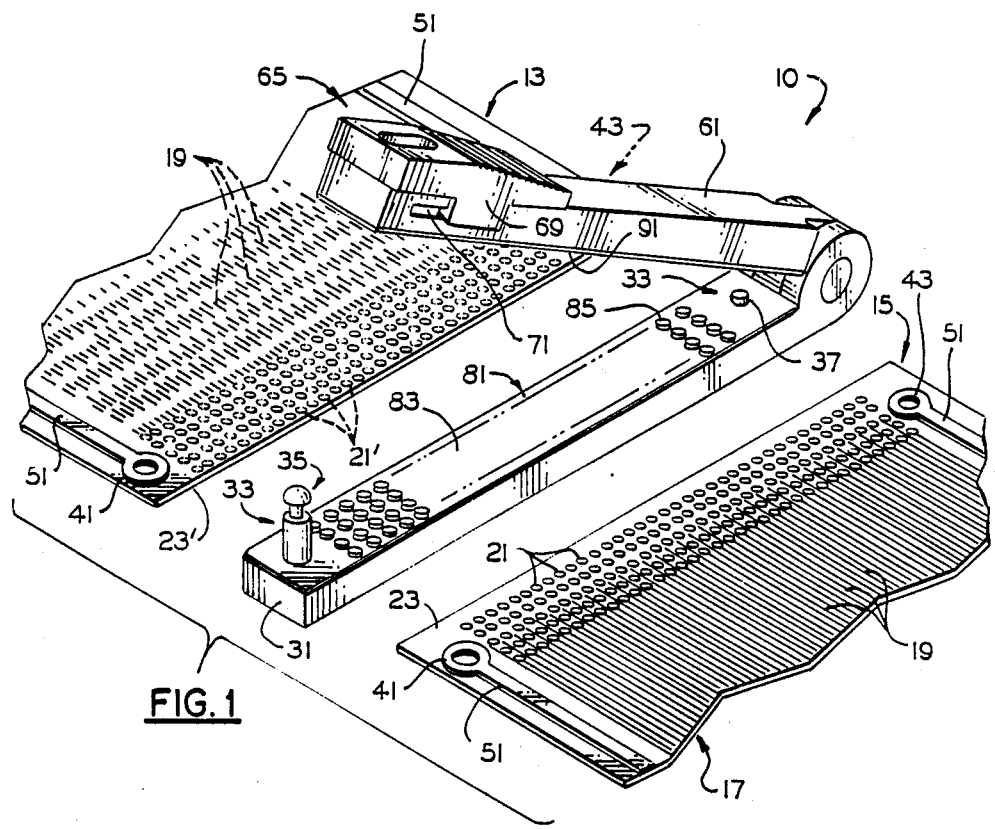
FIG. 1 is a perspective view of a flexible cable connector in accordance with one embodiment of the invention, said connector shown about to interconnect two separate flexible (flat) cables (or tapes) positioned in an overlapping arrangement where the circuitry on one is positioned in a facing arrangement relative to the circuitry on the other.

In FIG. 1, there is shown an exploded perspective view of a flexible cable connector 10 in accordance with one embodiment of the invention. Connector 10 is specifically designed for electrically interconnecting the respective circuitry on two separate flexible cables 13 and 15 such that the circuitry of these cables is in direct physical contact. By the term flexible cable as defined herein is meant to include a cable structure having a dielectric (electrically insulative) component and a plurality of electrical conductors therein and/or thereon. In the embodiment of FIG. 1, for example, the flat flexible cable 15 is shown as including the dielectric substrate 17 having thereon a plurality of individual conductive paths (wires) 19 which function to connect associated individual conductors 21 spacedly located in a predetermined, dense array on the upper surface 23 of the cable's dielectric 17. In the embodiment depicted in FIG. 1, for example, a total number of 375 conductor pads 21 can be utilized and spacedly oriented in five parallel rows (as shown) with each row of conductors located at a spacing of about 1.57 mm. from each other. In this arrangement, the conductors in each row can be spaced apart from about 0.750 mm. to about 0.780 mm. Conductor pads 21 may be of any known configuration (including cylindrical or rectangular) and may be comprised of known conductive material (e.g., copper) deposited upon the substrate's upper surface 23 in a conventional manner. The conductive circuit paths 19 may also be of this material and similarily deposited. It is also understood, that for purposes of the invention, it is possible to electrically interconnect flexible cables wherein the conductive paths are internally embedded within the dielectric and said paths are coupled to exposed conductor pads 21 by conventional means (e.g., plated thru holes). An acceptable dielectric material for use in such flexible cables is polyimide, a known material.

As shown in FIG. 1, each of the cables 13 and 15 is of substantially flat configuration and, in one embodiment of the invention, may possess a thickness of only about 0.127 mm. Flexible flat cables are known in the art and typically possess thicknesses anywhere from about 0.076 mm. to about 0.381 mm. Such cables are capable of being electrically connected using the connector of the instant invention. The above conductor pattern and conductive path arrangement shown in FIG. 1 is not meant to limit the invention. It is even within the scope of the invention to provide sound electrical interconnection between the exposed conductive wiring (paths) of such cables (e.g., as may be necessary in instances of repair or the like).

Figure 3:
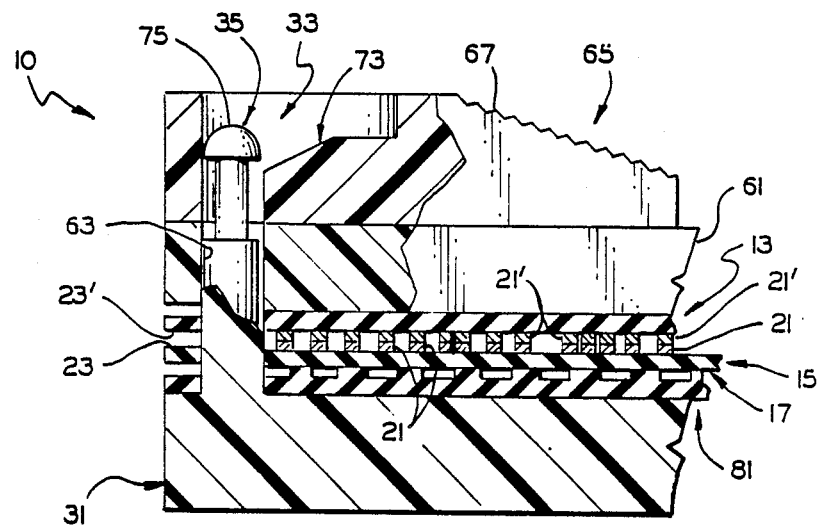
FIG. 3 is an enlarged, partial side view, partly in section, illustrating the connector of FIG. 1 in a position prior to final closure (clamping) of the positioned flexible cables therein.
Figure 4:
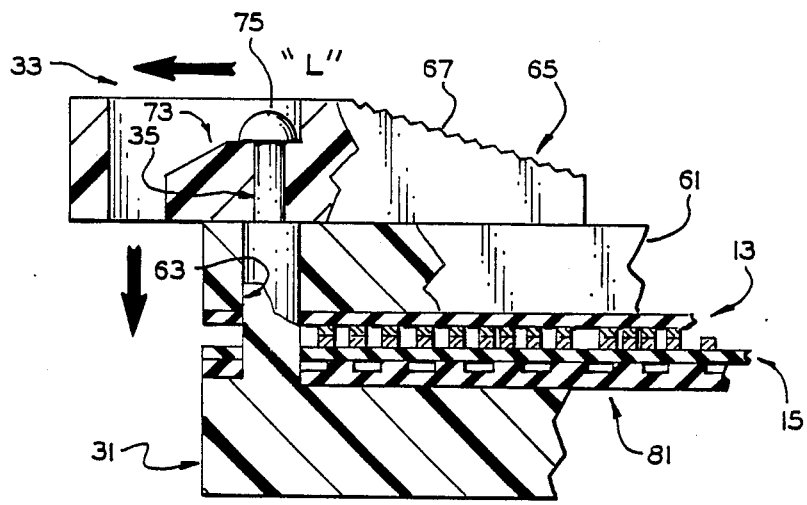
FIG. 4 is a view similar to FIG. 3 of the connector of FIG. 1, with the connector in the fully closed (and locked) position.

As shown in FIG. 1 and also in the enlarged, partial sectional views in FIGS. 3 and 4, the conductor pads (or contact elements 21, 21') are aligned and positioned in direct contact with each other when placed in connector 10. This represents a significant feature of the invention in that direct physical connection results in a more positive coupling of these conductive elements such that an additional means (e.g., metallic contact or the like) is not necessary. Thus, it is understood that the top cable 13 in FIG. 1 (in comparison to the bottom cable 15) is shown in an inverted position such that the contact elements 21' are located on the bottom surface 23' of this cable. Similarly, the conductive paths 19' are preferably located on the bottom or facing surface 23'.

In order to provide this unique form of connection, connector 10 includes a base member 31 of elongated configuration having thereon means 33 for aligning both cables such that the aforedefined direct contact is achieved. The preferred alignment means for use in the embodiment depicted in FIG. 1 is a pair of upstanding pins 35 and 37 located at opposing ends of the substantially flat upper surface on base 31 on which both flat cables are positioned. To accomplish such positioning, each cable preferably includes a pair of spaced apertures 41 and 43 on opposite sides thereof, each aperture designed for accommodating a singular one of the respective pins 35 or 37 shown in FIG. 1. To assure precise alignment between contact elements in a highly dense array as defined above, each aperture is oriented within a respective dielectric in precise registration with the remaining circuitry (19, 21) on the cable. Further, each aperture is at a diameter substantially the same as the outer diameter for each of the projecting cylindrical pins 35 and 37 such that a snug fit by the cable is assured. In one example of the invention, each pin may possess an outer diameter of about 3.180 mm. while the internal diameter for the corresponding aperture may be about 3.200 mm.

Further assurance of such precise alignment is made possible by the use of a quantity of reinforcement material 51 which substantially surrounds each of the respective apertures 41 and 43 and extends along the elongated sides of the thin flexible cable. This reinforcement material is preferably metallic (e.g., copper) and is deposited simultaneously with the placement of the remaining circuitry (19, 21) on the respective flat cable. Such a utilization of reinforcement material that not only further enhances the retention of the respective cables (thus providing supplemental strain relief) but also substantially prevents deformation to the respective cables as might occur during handling (including repair and/or replacement) is considered a significant feature of this invention. That is, such reinforcement material may serve to substantially prevent deformation to the respective side of the tape and, additionally, serve to substantially prevent undesirable crinkling or the like to this relatively thin and fragile product. In one embodiment of the invention, the copper reinforcement material may possess a thickness of about 0.071 mm. and a width of about 3.180 mm. Where said material 51 surrounds the respective apertures within the dielectric material of each cable, the encircling ring portion of each material may possess a width of about 2.00 mm.

Figure 2:
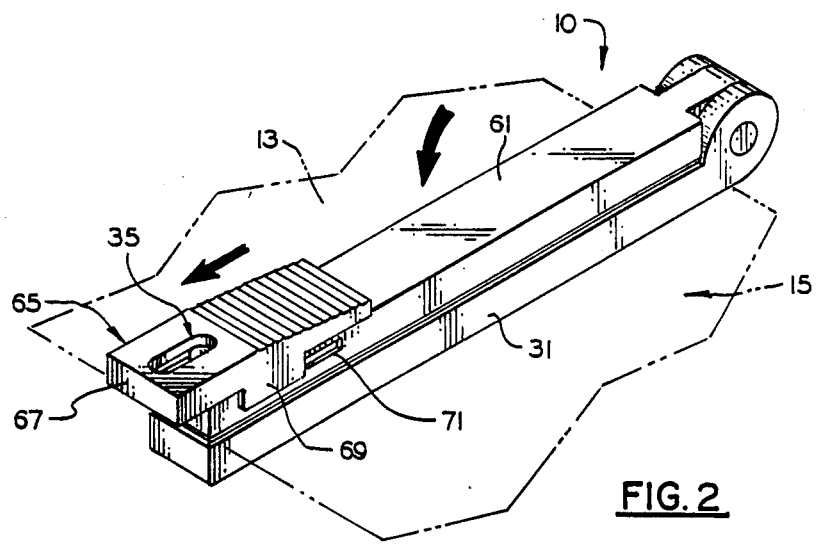
FIG. 2 is a perspective view of the connector of FIG. 1 in the closed (second) position, the two flexible cables being illustrated in phantom.

Connector 10 further includes a clamp member 61 which is movably positioned on base 31 and adapted for occupying a first (open) position (as shown in FIG. 1) and a second (closed) position (as shown in FIGS. 2 and 4) with respect to base member 31, the second (closed) position providing the necessary clamping force on the aligned flexible cables 13 and 15. Clamp 61, as shown in FIG. 1, is pivotally positioned on base 31 and thus moves downwardly in a substantially angular manner to the closed position. Once both cables are positioned in the facing relationship shown herein, the pivotal clamp is lowered thereon. Clamp 61 includes an opening 63 therein (FIG. 3) designed for aligning with and accommodating the upstanding pin 35. A similar opening (not shown) is provided in clamp 61 at the opposite end thereof to accommodate the upstanding, shorter pin 37. Clamp 61 is lowered onto pins 35 and 37 and is retained in the second, closed position by a retention means 65 which, as shown, is slidably positioned at the forward end of the elongated clamp member 61. As further shown in FIG. 2, this retention means comprises a locking member 67 with downwardly projecting side segments 69 which ride in elongated slots 71 formed within opposite sides of clamp member 61. Only one such slot and depending side is shown in FIG. 2 (and FIG. 1) and it is understood that similar members are provided on the opposite side (not shown) of clamp 61.

As best illustrated in FIGS. 3 and 4, the slidable retention means 65 is designed for engaging the upstanding pin 35 in a camming manner when the clamp member is located substantially within the second, closed position. As shown in FIGS. 3 and 4, the slidable clamp member includes a cam surface 73 which, when the retention member is moved laterally (direction "L" in FIG. 4), serves to engage the projecting head segment 75 of pin 35 as shown in these views. Thus, when head segment 75 slides over the angular first portion of surface 73 and onto the substantially horizontal end portion of this surface, the result is that the upper clamp member 61 is moved downwardly to the final, fully closed (clamped) position. This also results in the clamp member 61 being firmly locked into this final, closed position to thereby substantially prevent a separation (and disconnection) in future use. It is understood, however, that such separation can readily occur by an operator who chooses to return the slidable retention member to the original non-actuating position (FIG. 3).

As shown in FIG. 1, connector 10 further includes compressible means 81 in the form of an elastomeric member of insulative material (e.g., silicone rubber) which, in addition to providing a predetermined force against the bottom cable (against the lower surface thereof) during clamping, also provides accommodation for varying contact element thicknesses and for other elevational variations within the mating structures. Thus, the compressible, elastomeric member 81 serves to accommodate for manufacturing tolerances within the structures cited herein. The elastomeric member 81 preferably comprises a relatively thin substrate 83 having thereon a plurality of spaced protuberances 85 arranged in a predetermined pattern so as to exert the desired force against the bottom, substantially flat surface of cable 15 (and thus against the contact elements on the opposite surface). In one example of the invention, the elastomeric member 81 may possess a substrate thickness of only about 0.635 mm. while the overall average height of the respective protruberances is about 0.890 mm. for a combined average height for this member of about 1.520 mm. Alternatively, it is possible to use a pressure exertion member similar to that defined in the aforementioned U.S. Pat. No. 4,902,234 entitled, "Electrical Connector Assembly Including Pressure Insertion Member", (W. L. Brodsky et al), filed Nov. 3, 1988. As defined therein, the pressure exertion member includes a thin metallic base component, a resilient member and several compressible elements which project upwardly and form part of one side of this member. The disclosure of U.S. Pat. No. 4,902,234 is thus incorporated herein by reference. When using the elastomeric member as illustrated in FIGS. 1, 3 and 4, an average force within the range of about fifty grams to about seventy grams is produced against each of the described flexible cables. This force is deemed appropriate to provide a sound, effective connection between each of the respective pairs of facing, engaged contact elements 21 and 21'. To further assure a sound connection at this location, it is preferred that contact elements possessing a raised dot configuration be utilized. An example of such a contact element is described in the aforementioned, filed application Ser. No. 07/287,236, entitled "Connector For Connecting Flexible Film Integrated Circuit Carrier To Board Or Card And Use Thereof", filed Dec. 21, 1988. This disclosure is thus also incorporated herein by reference. As defined in Ser. No. 07/287,236, each contact element preferably includes a plurality of raised contact portions formed on the head section of each element. Such raised portions (e.g., three) serve to provide a concentrated force on the material against which it is engaged. Such an arrangement will also provide what may be referred to as a wiping type of contact in view of slight lateral displacement of the respective flexible cables during final clamping. This is considered a significant feature of the invention, because such wiping motion serves to effectively displace contaminants which may be found on the respective contact elements and which may adversely affect the provision of a sound contact at this location. This unique arrangement is particularly desired when subsequent replacements of connector 10 and/or cables 13 or 15 is expected. In the event that a permanent connection is to be used for two such cable members, it is possible to use contact elements 21 and 21' of substantially flat configuration such that wiping in the manner defined herein is not used. Thus, such positive connection will occur after it is assured that each of these elements possesses a clean upper surface.

Final clamping of connector 10 results in compression of the elastomeric's protuberances 85 as shown in FIG. 4. It is as a result of this compression that the defined force is exerted against the adjacent, contiguous flexible cable 15.

The base and clamp members of connector 10 may be of plastic (e.g., phenolic) or of a lightweight metal (e.g., aluminum or magnesium). The slidable retention member 65 is preferably also of plastic but may be comprised of either of these materials. In the arrangement depicted in FIG. 1, it is preferred that the elastomeric pad member 81 be secured in position (e.g., using a suitable adhesive) by bonding the bottom surface of this member to the flat top surface of base member 31. Another method of securing these is to vulcanize the pad directly onto base 31. It is to be understood that it is also within the scope of the invention to position this member on the corresponding facing surface 91 of the upper clamp member 61 such that this elastomeric member will instead exert a downward force on the top cable 31 during closure. It is also readily possible in the invention to utilize two separate elastomeric members, each being positioned on a respective one of the defined surfaces for the clamp and base members of connector 10. As shown in FIGS. 3 and 4, the upstanding pin 35 (and also preferably the upstanding pin 37) constitutes an upward projection (or extension) of base 31 and is thus an integral part thereof. Alternatively, each pin may comprise a separate element securedly positioned within the respective base member.

Figure 5:
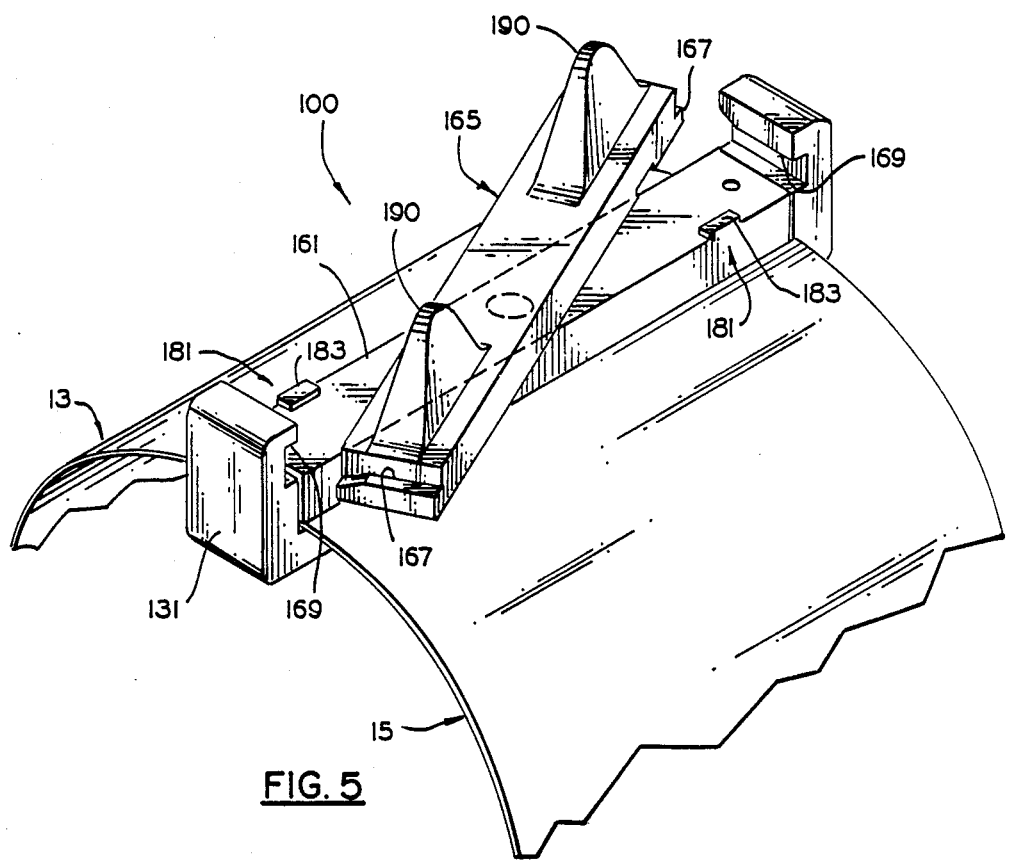
FIG. 5 is a perspective view of a flexible cable connector in accordance with another embodiment of the invention.
Figure 6:
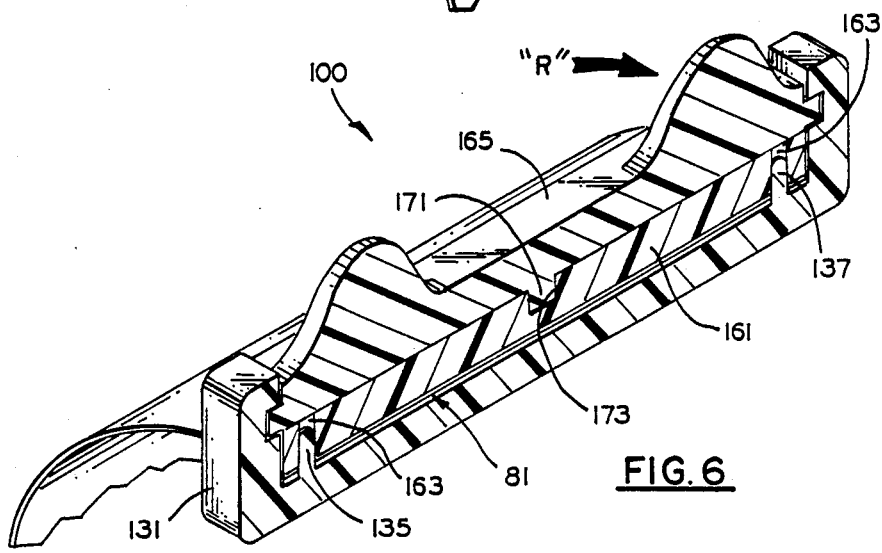
FIG. 6 is a perspective view of the connector of FIG. 5 in the fully clamped position.

In FIGS. 5 and 6, there is depicted a connector 100 in accordance with another embodiment of the invention. Connector 100, like connector 10 described above, is designed for connecting the circuitry on a pair of cables of (top and bottom) of similar construction to those defined in FIG. 1 above. Like numerals are thus provided for like components herein. In the embodiment of FIGS. 5 and 6, however, the defined clamp retention member 165 is rotationally positioned on the upper clamp member 161 which, as shown in FIGS. 5 and 6, is located atop the two cables when these cables are positioned within (atop) the base 131. Thus, once the two cables are positioned in place (e.g., using upstanding alignment pins 135 and 137 (FIGS. 6) the upper clamp member is located thereover and the rotational retention means (in the form of an elongated arm) is rotationally moved (direction "R" in FIG. 6) such that outer surfaces 167 thereof engage respective surfaces 169 within the upstanding end portions of base 131 in a camming type of engagement. Once this engagement occurs, the rotational retention means 165 exerts a downward force on clamp member 161 which in turn provides a clamping force downwardly onto the uppermost cable (13). As in the embodiment in FIG. 1, an elastomeric member 81 is also preferably used, this member also preferably located on the flat upper surface of the lower base member 131. The sectional view through the approximate center of connector 100 as shown in FIG. 6 clearly illustrates this arrangement. The described rotational movement is provided through the use of a projecting pin 171 which is inserted within a corresponding hole 173 located within the upper clamp member at the approximate mid point thereof. Stop means 181, in the form of a pair of positioned projections 183 on clamp member 161, serve to prevent further rotation of retention member 165 beyond the final closed position depicted in FIG. 6. Apertures 163 are shown as being provided within the upper clamp member to accommodate each of the upstanding pins 135 and 137 which project upwardly and form an integral part of base 131. To facilitate rotation of retention arm member 165, a pair of curvilinear tabs 190 are provided within the arm member's upper surface for engagement by the connector operator.

The retention, clamp and base members of connector 100 may be comprised of the same material as their counterpart members described for connector 10.

Thus there has been shown and described an electrical connector for electrically connecting circuitry (e.g., an array of closely positioned contact elements) on two separate flexible cable members in a simple yet effective manner. The connector as defined herein is of relatively simple construction while still assuring a sound effective connection. The connector as defined herein is able to provide a relatively high contact force between such contact elements.

What is claimed is:

1. An electrical connector for electrically connecting the circuitry on first and second flexible cables each having a pair of spaced-apart apertures therein, said connector comprising:

a base member adapted for having said first and second flexible cables located thereon such that said circuitry thereof is oriented in a facing relationship;

means on said base member for aligning said circuitry of said first and second flexible cables in precise alignment with respect to each other, said means including first and second upstanding pins, each of said pins adapted for being positioned within a respective one of said apertures of each of said flexible cables;

a clamp member movably positioned on said base member and adapted for occupying first and second positions with respect thereto, said clamp and base members clamping said first and second flexible cables together when said clamp member occupies said second position such that the circuitry on said first flexible cable directly contacts the circuitry on said second flexible cable;

compressible means located between said base member and said clamp member for engaging at least one of said flexible cables during said clamping thereof and for being compressed during said clamping, said compressible means exerting a predetermined force against said engaged flexible cable when so compressed; and retention means for retaining said clamp member in said second position with respect to said base member, said electrical connector providing high density connection between said flexible cables, said connector including a quantity of reinforcement material located substantially about each of said apertures in said flexible cables and extending along the sides of said flexible cables to thereby substantially prevent deformation to said sides of said flexible cables.

2. The electrical connector according to claim 1 wherein said compressible means comprises an elastomeric member, said elastomeric member being located on said base member.

3. The electrical connector according to claim 1 wherein said circuitry of at least one of said flexible cables includes a plurality of contact elements as part thereof and positioned on said cable in a predetermined pattern, each of said contact elements possessing a raised configuration to thereby provide enhanced connection with said circuitry of the other of said flexible cables.

4. The electrical connector according to claim 1 wherein said base member is of elongated configuration and includes a substantially flat surface thereon, said first flexible cable being located on said flat surface and said second flexible cable being positioned on said first cable.

5. The electrical connector according to claim 4 wherein said first and second upstanding pins are spacedly positioned on said substantially flat surface of said base member.

6. The electrical connector according to claim 5 wherein said circuitry of each of said flexible cables is positioned within said cable in precise registration with respect to said pair of spaced apart apertures therein.

7. The electrical connector according to claim 6 wherein said quantity of reinforcement material located substantially about each of said apertures is adapted for providing supplemental strain relief for said flexible cables when said cables are clamped together by said base and clamp members.

8. The electrical connector according to claim 7 wherein said reinforcement material comprises a layer of metallic material.

9. The electrical connector according to claim 8 wherein said metallic material is copper.

10. The electrical connector according to claim 1 wherein said retention means is located on said clamp member and said base member includes at least one upstanding pin thereon, said retention means engaging said pin member in a camming manner when said clamp member occupies said second position with respect to said base member.

11. The electrical connector according to claim 10 wherein said retention means is slidably located on said clamp member and includes a cam surface as part thereof, said pin engaging said cam surface, causing said clamp member to compress against said flexible cables when said retention means is slidably moved on said clamp member.

12. The electrical connector according to claim 10 wherein said clamp member is pivotally positioned on said base member.

13. An electrical connector for electrically connecting the circuitry on first and second flexible cables each having a pair of spaced-apart apertures therein, said connector comprising:

a base member adapted for having said first and second flexible cables located thereon such that said circuitry thereof is oriented in a facing relationship;

means on said base member for aligning said circuitry of said first and second flexible cables in precise alignment with respect to each other, said means including first and second upstanding pins, each of said pins adapted for being positioned within a respective one of said apertures of each of said flexible cables;

a clamp member positioned atop said flexible cables located on said base member and adapted for occupying first and second positions with respect to said base member, said clamp member and said base member clamping said first and second flexible cables together when said clamp member occupies said second position such that the circuitry on said first flexible cable directly contacts the circuitry on said second flexible cable;

compressible means located between said base member and said clamp member for engaging at least one of said flexible cables during said clamping thereof and for being compressed during said clamping, said compressible means exerting a predetermined force against said engaged flexible cable when so compressed; and retention means movably positioned on said clamp member for retaining said clamp member against said flexible cables when said clamp member occupies said second position, said electrical connector providing high density connection between said flexible cables, said connector including a quantity of reinforcement material located substantially about each of said apertures in said flexible cables and extending along the sides of said flexible cables to thereby substantially prevent deformation to said sides of said flexible cables.

14. The electrical connector according to claim 13 wherein said compressible means comprises an elastomeric member, said elastomeric member being located on said base member.

15. The electrical connector according to claim 13 wherein said circuitry of at least one of said flexible cables includes a plurality of contact elements as part thereof and positioned on said cable in a predetermined pattern, each of said contact elements possessing a raised configuration to thereby provide enhanceed connection with said circuitry of the other of said flexible cables.

16. The electrical connector according to claim 13 wherein said base member is of elongated configuration and includes a substantially flat surface thereon, said first flexible cable being located on said flat surface and said second flexible cable being positioned on said first cable.

17. The electrical connector according to claim 16 wherein said first and second upstanding pins are spacedly positioned on said substantially flat surface of said base member.

18. The electrical connector according to claim 17 wherein said circuitry of each of said flexible cables is positioned within said cable in precise registration with respect to said pair of spaced apart apertures therein.

19. The electrical connector according to claim 18 wherein said quantity of reinforcement material located substantially about each of said apertures is adapted for providing supplemental strain relief for said flexible cables when said cables are clamped together by said base and clamp members.

20. The electrical connector according to claim 19 wherein said reinforcement material comprises a layer of metallic material.

21. The electrical connector according to claim 20 wherein said metallic material is copper.

22. The electrical connector according to claim 13 wherein said retention mean sis rotationally located on said clamp member and includes a cam surface as part thereof, said cam surface engaging said base member during rotational movement of said retention member to cause said clamp member to move from said first position to said second position, thereby causing said clamp and base members to compress said flexible cables.

23. The electrical connector according to claim 22 wherein said retention means comprises an arm member including a projecting pin therein, said clamp member including a hole therein in which said projecting pin is located during said rotational movement of said arm.

* * * * *